(12) United States Patent  (10) Patent No.: US 8,242,613 B2
Verma et al.  (45) Date of Patent: Aug. 14, 2012

(54) BOND PAD FOR SEMICONDUCTOR DIE

(75) Inventors: Chetan Verma, Noida (IN); Shailesh Kumar, Ghaziabad (IN); Meng Kong Lye, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 238 days.

(21) Appl. No.: 12/874,204

(22) Filed: Sep. 1, 2010

(65) Prior Publication Data

US 2012/0049389 A1  Mar. 1, 2012

(51) Int. Cl.
*H01L 23/488* (2006.01)
*H01L 23/485* (2006.01)
*H01L 21/768* (2006.01)
*H01L 23/48* (2006.01)

(52) U.S. Cl. ......... 257/786; 257/E23.023; 257/E23.179; 257/E23.002; 257/E21.59; 257/E23.01; 257/E23.153; 257/782; 257/203; 257/620; 257/211; 257/207; 257/208; 257/691; 257/E27.11; 257/775; 257/776; 257/774; 257/773; 257/48

(58) Field of Classification Search ........ 257/782, 257/E23.01, E23.023, E23.153, 203, 620, 257/E27.11, 773, 774, E21.536, E23.179, 257/E23.002, E21.59, 775, 776, E23.02, 257/48, 784, 786; 438/612; 361/405, 392, 361/400; 326/47; 174/52.4
See application file for complete search history.

(56) References Cited

U.S. PATENT DOCUMENTS

| | | | |
|---|---|---|---|
| 4,875,138 A * | 10/1989 | Cusack | ............ 174/557 |
| 5,401,689 A | 3/1995 | Frei | |
| 5,441,917 A | 8/1995 | Rostoker | |
| 5,544,804 A | 8/1996 | Test | |
| 5,565,385 A | 10/1996 | Rostoker | |
| 5,594,273 A | 1/1997 | Dasse | |
| 5,635,424 A | 6/1997 | Rostoker | |
| 5,693,565 A | 12/1997 | Camilletti | |
| 5,786,701 A | 7/1998 | Pedder | |
| 5,891,745 A | 4/1999 | Dunaway | |
| 6,031,293 A | 2/2000 | Hsuan | |
| 6,143,668 A | 11/2000 | Dass | |
| 6,166,556 A | 12/2000 | Wang | |
| 6,489,688 B1 | 12/2002 | Baumann | |

(Continued)

*Primary Examiner* — A O Williams

(74) *Attorney, Agent, or Firm* — Charles Bergere

(57) ABSTRACT

A semiconductor die has rows of bond pads along the edges of a major surface. The corners of the die are designated as keep out areas, with design layout rules prohibiting a probe-able bond pad from being placed in the keep out areas so that a minimum distance may be maintained between distal ends of adjacent rows of bond pads (i.e., bond pads along adjacent edges). The bond pads of each row have IO pad areas that are aligned with each other and IO probe areas that are aligned with each other. A generally L-shaped bond pad includes a first, vertical part that extends inwardly from an edge of the semiconductor die and a second, horizontal part connected to the vertical part. The L-shaped bond pad may be placed between a last bond pad in a row and a corner keep out area, and the second part of the L-shaped bond pad extends into the corner keep out area. The first part has an IO pad area that is in alignment with the IO pad areas of the other bond pads in the same row, and the second part has an IO probe area that is in alignment with the IO probe areas of the bond pads in the adjacent row. The L-shaped bond pad does not violate design rules even though a part of the pad extends into the corner keep out area.

16 Claims, 4 Drawing Sheets

U.S. PATENT DOCUMENTS

| | | | |
|---|---|---|---|
| 6,563,226 | B2 | 5/2003 | Harun |
| 6,921,979 | B2 | 7/2005 | Downey |
| 7,042,098 | B2 | 5/2006 | Harun |
| 7,064,450 | B1 | 6/2006 | Eghan |
| 7,071,561 | B2 | 7/2006 | Chen |
| 7,078,796 | B2 | 7/2006 | Dunn |
| 7,847,418 | B2 * | 12/2010 | Ohnishi et al. ............... 257/784 |
| 8,017,943 | B2 * | 9/2011 | Ojiro ............... 257/48 |
| 8,115,321 | B2 * | 2/2012 | Ali et al. ............... 257/782 |
| 8,154,054 | B2 * | 4/2012 | Maede ............... 257/203 |
| 2002/0070450 | A1 | 6/2002 | McKnight |
| 2006/0000876 | A1 | 1/2006 | Nickerson |
| 2006/0071685 | A1 * | 4/2006 | Lin et al. ............... 326/47 |
| 2007/0210442 | A1 | 9/2007 | Hess |
| 2008/0029887 | A1 | 2/2008 | Ramanathan |
| 2008/0182120 | A1 | 7/2008 | Tan |
| 2009/0051050 | A1 | 2/2009 | Bakker |
| 2009/0079082 | A1 | 3/2009 | Liu |
| 2010/0117083 | A1 * | 5/2010 | Ohnishi et al. ............... 257/48 |
| 2010/0140814 | A1 | 6/2010 | Jones |
| 2010/0252830 | A1 * | 10/2010 | Osajima ............... 257/48 |
| 2010/0276816 | A1 * | 11/2010 | Ali et al. ............... 257/782 |

* cited by examiner

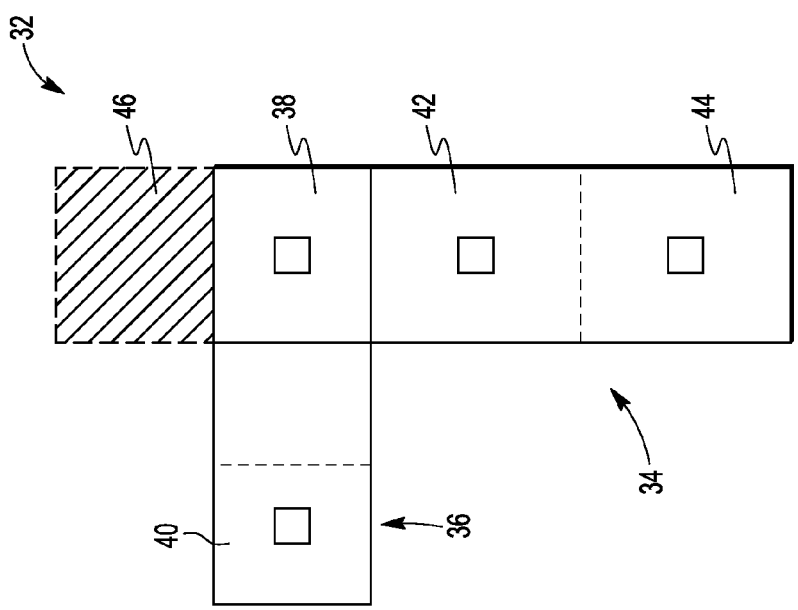
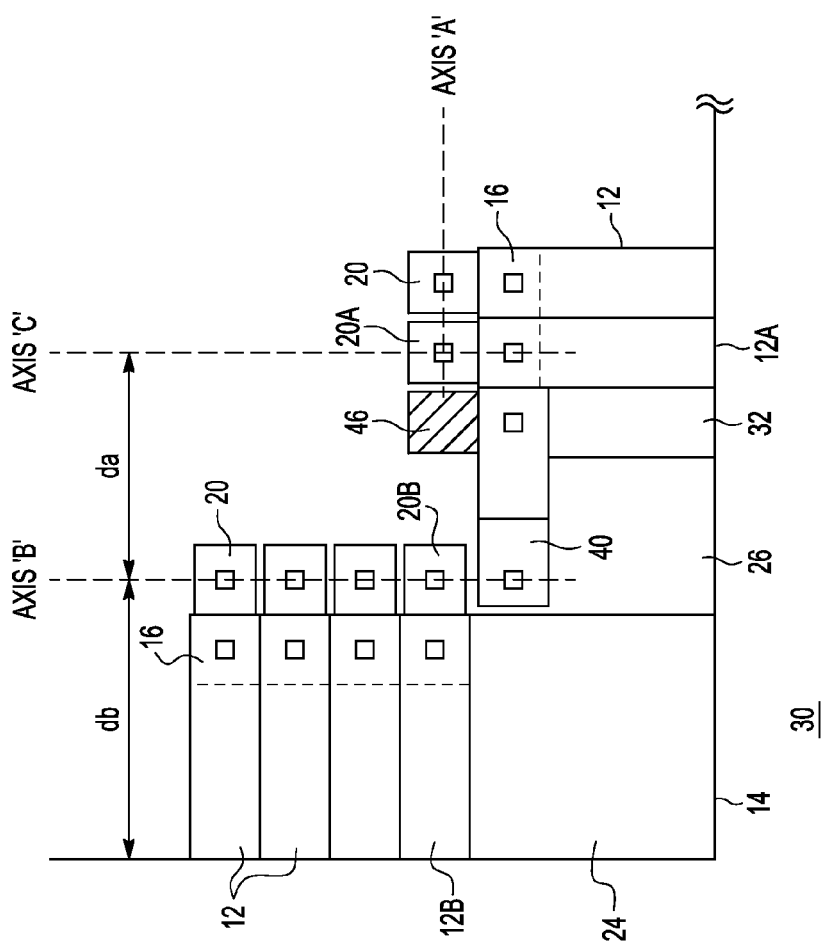
FIG. 4
FIG. 3

BOND PAD FOR SEMICONDUCTOR DIE

BACKGROUND OF THE INVENTION

The present invention relates to semiconductor devices and more particularly to a bond pad and the physical layout of a bond pad on a semiconductor die.

Bond pads are formed on a semiconductor die to provide means for transferring electrical signals and power to and from circuitry of the semiconductor die via probes, bond wires, conductive bumps, etc. Bond pads are typically arranged in rows along the perimeter of the semiconductor device, or in an array format. To accommodate increases in semiconductor device densities and input/output (I/O) requirements, semiconductor device manufacturers are looking to reduce the spacing between bond pads, known as pitch. However, bond pad pitch reduction poses a number of assembly problems. For example, because spacing between bond wires is reduced when bond pad pitch is reduced, there is an increased risk of wire shorting arising from wire looping and wire trajectory variations and from wire sweep during mold encapsulation; that is, the flow of mold compound pushing wires into contact with each other.

FIG. 1 is an enlarged top plan view of a corner of a conventional semiconductor die 10 having bond pads 12 along its perimeter 14 and FIG. 2 is an enlarged top plan view of one of the bond pads 12. Each of the bond pads 12 may include a bond wire or input/output (IO) pad area 16 for receiving a bond wire, a Power Ground Embedded (PGE) area 18 for an embedded power or embedded ground pad, an IO probe area 20 and a PGE probe area 22. The probe areas 20 and 22 allow for testing of the IO pad area 16 and the PGE area 18, respectively, using test equipment at probe level before the semiconductor die has been packaged. Referring to FIG. 1, the bond pads 12 are laid out in rows along the perimeter 14, and the corner of the die 10 may be either empty or have a corner pad 24. Further, it can be seen that the IO probe areas 20 for the respective rows of bond pads 12 are aligned. That is, the bond pads 12 along the bottom (horizontal) row have their IO probe areas 20 aligned and the bond pads 12 along the side (vertical) row have their IO probe areas 20 aligned.

In order to allow probing of multiple semiconductor dies so as to reduce the test cost, there are certain design rules that must be followed when laying out the bond pads 12 along the perimeter 14 of the die 10. One such rule, sometimes referred to as a corner keep out rule, is that the IO probe area 20A of the bond pad 12A (along the bottom row and closest to the corner) must be separated from the IO probe area 20B of the bond pad 12B (along the side row and closest to the corner) by a minimum predetermined distance, denoted as d. This predetermined distance d depends upon the probing technique to be used for testing multiple die simultaneously. Unfortunately, this design rule results in a wasted space area 26. Note that the wasted space area 26 occurs at or near all four corners of the die 10. U.S. Patent Publication No. 2009/0051050 proposes accommodating a bond pad inside a corner wasted space area. However, to place the bond pad in the wasted space area 26, the size and layout of the bond pads are altered in such a way that the bond pads near to the corner do not have their probe areas aligned with the probe areas of the other bond pads in the same row (along the same side of the die). Another problem with this approach is that any such bond pad placed in the wasted space area 26 cannot be readily probed without increasing the test time many fold.

Thus, there is a need for a way to increase the number of bond pads on a high density semiconductor device without violating any probing rules yet still allowing for parallel probing so as not to increase test costs.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 3 is an enlarged top plan view of a corner of a semiconductor die in accordance with an embodiment of the present invention;

FIG. 4 is an enlarged plan view of an additional bond pad of the semiconductor die of FIG. 3;

DETAILED DESCRIPTION OF THE INVENTION

Figure 2:
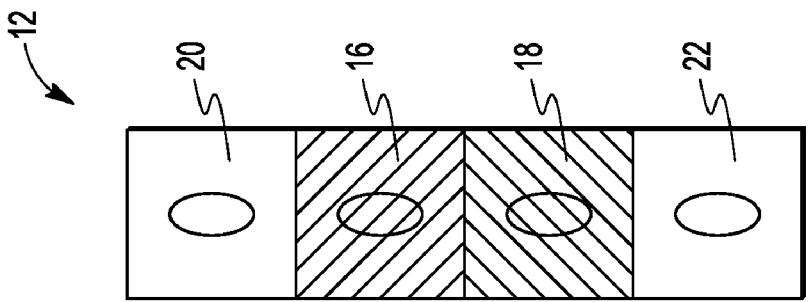
FIG. 2 is an enlarged plan view of a bond pad of the semiconductor die of FIG. 1.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a semiconductor die having a first row of bond pads disposed along a first edge of the device and a second row of bond pads disposed along a second edge of the device. The second row is perpendicular to the first row. Each bond pad includes at least an input/output (IO) pad area for providing an IO connection to circuitry of the device and an IO probe area for receiving a tip of a test probe. The IO pad areas of the bond pads of the first row are aligned with each other, the IO probe areas of the bond pads of the first row are aligned with each other, and the IO probe areas of the bond pads of the second row are aligned with each other. A first corner keep out area is located between the first and second rows at a first corner of the device. Design layout rules specify that a bond pad that is to be probed cannot be placed in the first corner keep out area without breaking the parallelism required in probing and increasing the probe test cost. A first L-shaped additional bond pad is placed between the first corner keep out area and a first bond pad in the first row of bond pads. The additional bond pad has an IO pad area that is aligned with the IO pad areas of the bond pads of the first row. The additional bond pad also has an IO probe area that extends into the first corner keep out area so that the IO probe area of the additional bond pad is aligned with the IO probe areas of the second row.

In another embodiment, the present invention provides a semiconductor die having a first row of bond pads disposed along a first edge of the device, a second row of bond pads disposed along a second edge of the device, wherein the second row is perpendicular to the first row, a third row of bond pads disposed along a third edge of the device, wherein the third row is perpendicular to the first row and parallel to the second row, and a fourth row of bond pads disposed along a fourth edge of the device, wherein the fourth row is parallel to the first row and perpendicular to the second and third rows. Each bond pad includes at least an input/output (IO) pad area for providing an IO connection to circuitry of the device and an IO probe area for receiving a tip of a test probe. The IO pad areas of each row are aligned with the other IO pad areas of the same row and the IO probe areas of each row are aligned with the other IO probe areas of the same row. The device also has first, second, third and fourth corner keep out areas respectively located in the four corners of the semiconductor die, where design layout rules specify that bond pads that are to be probed cannot be placed in the corner keep out areas without breaking the parallelism required in probing and increasing the probe test cost. A first L-shaped additional bond pad is located between the first corner keep out area and a first bond pad in the first row of bond pads. The first additional bond pad has an IO pad area that is aligned with the IO pad areas of the bond pads of the first row. The IO probe area extends into the first corner keep out area so that an IO probe area of the first additional bond pad can be aligned with the IO probe areas of the bond pads of the second row. The device also has second, third and fourth additional bond pads. The second L-shaped additional bond pad is located between the second corner keep out area and a last bond pad in the first row of bond pads, a third L-shaped additional bond pad is located between the third corner keep out area and a first bond pad in the fourth row of bond pads, and the fourth L-shaped additional bond pad is located between the fourth corner keep out area and a last bond pad in the fourth row of bond pads.

The second additional bond pad has an IO pad area that is aligned with the IO pad areas of the bond pads of the first row and an IO probe area that is aligned with the IO probe areas of the bond pads of the third row, and the IO probe area extends into the second corner keep out area. The third additional bond pad has an IO pad area that is aligned with the IO pad areas of the bond pads of the fourth row and an IO probe area that is aligned with the IO probe areas of the bond pads of the second row, and the IO probe area extends into the third corner keep out area. The fourth additional bond pad has an IO pad area that is aligned with the IO pad areas of the bond pads of the fourth row and an IO probe area that is aligned with the IO probe areas of the bond pads of the third row, and the IO probe area extends into the fourth corner keep out area.

In yet another embodiment, the present invention provides an additional bond pad for a semiconductor die. The semiconductor die has first and second major surfaces and four sides, and keep out areas in the four corners of the first major surface. Design probing rules for the die specify that bond pads that are to be probed are not to be placed within the corner keep out areas. The die has rows of generally rectangular bond pads located along respective sides on the first major surface between respective corner keep out areas. The bond pads have an IO pad area proximate a central part of the bond pad and an IO probe area at a distal end of the bond pad (the distal end being the end of the bond pad that is spaced from the edge of the die). The IO pad areas of each row are aligned and the IO probe areas of each row are aligned. The additional bond pad is L-shaped, having a first, vertical section with a proximal end that extends from one of the sides of the semiconductor die inwardly to a distal end. The vertical section is located between one of the corner keep out areas and an adjacent bond pad. The first section has an IO pad area at the distal end that is aligned with the IO pad areas of the bond pads in the same row. A second, horizontal section abuts the distal end of the first section and extends away from the first section toward and into the adjacent corner keep out area. The second section has a probe area at a distal end (the end in the corner keep out area) thereof that is aligned with the probe areas of bond pads in an adjacent row. A predetermined minimum distance is maintained between the IO probe area of a first bond pad in a first one of the rows and the IO probe areas of the bond pads of an adjacent row of bond pads, including the IO probe area of the additional bond pad.

Figure 1:
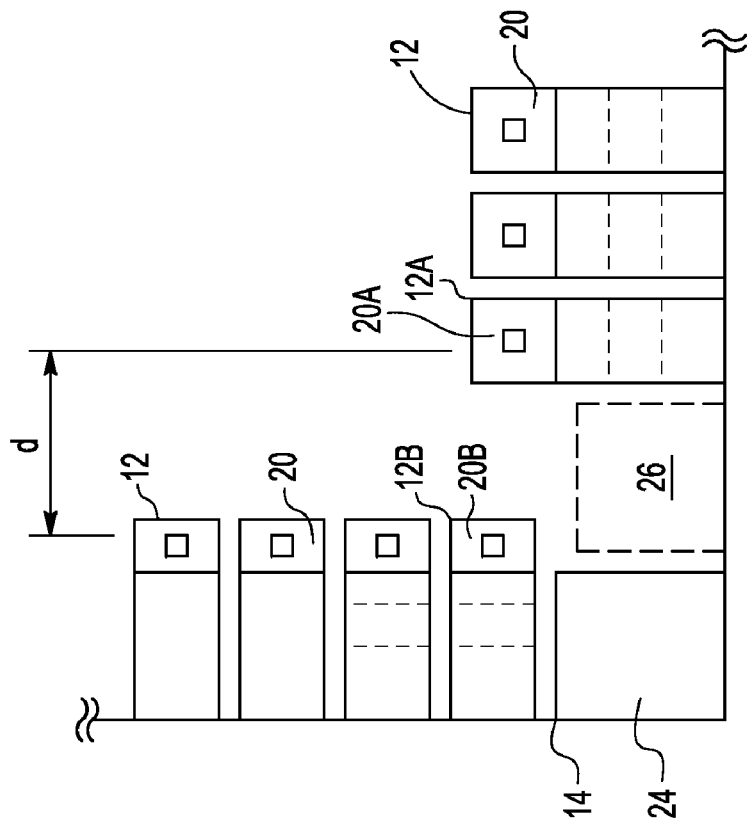
FIG. 1 is an enlarged top plan view of a corner of a conventional semiconductor die.

Referring now to FIG. 3, a top plan view of a corner of a semiconductor die 30 in accordance with an embodiment of the present invention is shown. The die 30 is similar to the die 10 shown in FIG. 1 in that the die 30 is generally rectangular and has a perimeter or edge 14 and rows of bond pads 12 that extend along each side between corner pads 24.

The semiconductor die 30 may be a processor, such as a digital signal processor (DSP), a special function circuit, such as a memory address generator, or a circuit that performs any other type of function. The semiconductor die 30 is not limited to a particular technology such as CMOS, or derived from any particular wafer technology. Further, the present invention can accommodate devices of various sizes, as will be understood by those of skill in the art. A typical example is a memory device having a size of about 15 millimeters (mm) by 15 mm. The semiconductor die 30 is formed in a known manner using conventional semiconductor device fabrication processes. Accordingly, further description of the manufacture of the semiconductor die 30 is not required for a complete understanding of the present invention.

Each of the bond pads 12 includes at least an input/output (IO) pad area 16 (FIG. 4) for providing an IO connection to circuitry of the die 30 and an IO probe area 20 for receiving a tip of a test probe. The IO pad areas 16 in each row are aligned with each other as are the IO probe areas 20 of each row. FIG. 3 illustrates that the IO probe areas 12 of the bond pads in a first row (the horizontal row in FIG. 3) are aligned with each other along an axis A. FIG. 3 also illustrates that the IO probe areas of a second row (the vertical row in FIG. 3) are aligned with each other along axis B.

The bond pads are provided for receiving wires and probe tips and the sites for receiving the bond wires and probe tips are indicated as boxes. However, as understood by those of skill in the art, the wire or probe tip need not be exactly centered and thus the boxes are for illustration only.

The die 30 also includes corner bond pads 24 that are located in the corners of the die 30 and separate adjacent rows of the bond pads 12. The corner bond pads 24 typically are used for providing continuity to the power and ground connections along the pad areas across the edges of the die. Further, the corner pad can have ESD (electrostatic discharge) protection devices, decoupling capacitors and additional active circuitry, as is understood by those of skill in the art. Adjacent to one side of the corner bond pads 24 are corner keep out areas 26. The corner keep out areas 26 define an area in which bond pads that are to be tested by probing are not to be placed or laid out since such bond pads would break the probing design rules that allow parallelism in probing multiple semiconductor dies simultaneously, thereby greatly increasing the probe testing cost. One way to define the size of the corner keep out areas 26 is to determine a minimum distance the IO probe area 20A of a bond pad 12A in the first row must be spaced from the IO probe area 20B of a bond pad 12B in the second row, which is shown in FIG. 3 as distance da between axis B and axis C. The particular sizing of the corner keep out area 26 will vary depending on the die size, bond pad size, chip technology, and the type of probing being done, as understood by those of skill in the art. For example, for a 3976 um×4396 um C90 technology die having bond pads with a length of about 249 um (distance db) and a width of about 56 um, the minimum distance da and, in order to accommodate cantilever type probing the width of the corner keep out areas 26 is about 170 um. If a vertical probing technique is used then the minimum distance may be reduced to about 110 um. Design layout rules specify that bond pads 12 may not be placed within the corner keep out areas 26 in order to accommodate such parallel probe testing, which is the norm because of reduced test cost, as is understood by those of skill in the art.

However, the inventors of the present innovation have discovered that additional bond pads may be placed in the two opposing rows of bond pads between the corner keep out areas 26 and the bond pad 12A adjacent thereto. The additional bond pads involve the addition of a custom probe shape in the appropriate layout layer that is accessible for probing and bonding, for example, the Al-cap layer, which may be formed over any I/O pad in a cell library. FIG. 3 shows a first additional bond pad 32, which, as discussed in more detail below, includes both an IO pad area and an IO probe area. The additional bond pad 32 has an IO pad area that is in line with the other IO pad areas in the same row and an IO probe area that is in line with the IO probe areas in an adjacent row. Importantly, the IO probe area of the additional bond pad 32 is arranged within the corner keep out area 26. However, since a minimum distance between the bond pads 12 in one row to the bond pads in an adjacent row in maintained, there is no actual design rule violation. Thus, the present invention makes use of the corner keep out area 26 and allows the placement of additional probe-able bond pads, which helps minimize die area of the pad limited semiconductor die.

Referring now to FIG. 4, the additional bond pad 32 is L-shaped and includes a first, vertical part 34 and a second, horizontal part 36 that extends perpendicularly from the first part 34. Near a distal end of the first part 34, there is an IO pad area 38 for receiving a bond wire. The second part 36 includes an IO probe area 40 for receiving a probe tip, for example when the die is being tested after fabrication. The IO probe area 40 is spaced from the IO pad area 38 by a distance such that the IO probe area 40 will be in alignment with the IO probe areas of the bond pads of an adjacent row of bond pads (as shown in FIG. 3) and the IO pad area 38 is arranged so that it is in alignment with the IO pad areas of the other bond pads in the same row (along the same edge of the die).

In one embodiment, the first part 34 of the bond pad 32 also includes a PGE pad area 42 and a PGE probe area 44. Preferably the PGE pad area 42 and the PGE probe area 44 are arranged such that they are aligned respectively with the PGE pad areas and PGE probe areas of the other bond pads in the same row. The bond pad 32 may have the same height as a normal bond pad 12 and as such, includes an unused area 46. Thus, the first part 34 of the additional bond pad 32 has the same configuration as a normal bond pad 12 except that the distal end that would normally be the IO probe area is unused.

Referring again to FIG. 3, the bond pads 12 of the first row of bond pads have a proximal end adjacent to the first edge and a distal end spaced from the first edge. The IO pad areas 16 are proximate to the centers of the bond pads 12 and the IO probe areas 20 are located at the distal ends of the bond pads 12. The bond pads 12 of the second row (vertical row) have a proximal end adjacent to the second edge and a distal end spaced from the second edge, with the IO pad areas 16 being proximate to the centers of the bond pads 12 and the IO probe areas 20 being located at the distal ends of the bond pads 12.

Although not shown in FIG. 3, the bond pads 12 of the first and second rows may include an embedded power or ground (PGE) pad area and a PGE probe area. The PGE probe areas are located at the proximal ends of the bond pads and the PGE pad areas are located between the PGE probe areas and the IO pad areas 16.

As previously discussed, in one embodiment, the first additional bond pad 32 has a PGE pad area 42 that is aligned with the PGE pad areas 18 of the bond pads 12 of the first row, and a PGE probe area 44 that is aligned with the PGE probe areas 22 of the bond pads 12 of the first row.

Figure 5:
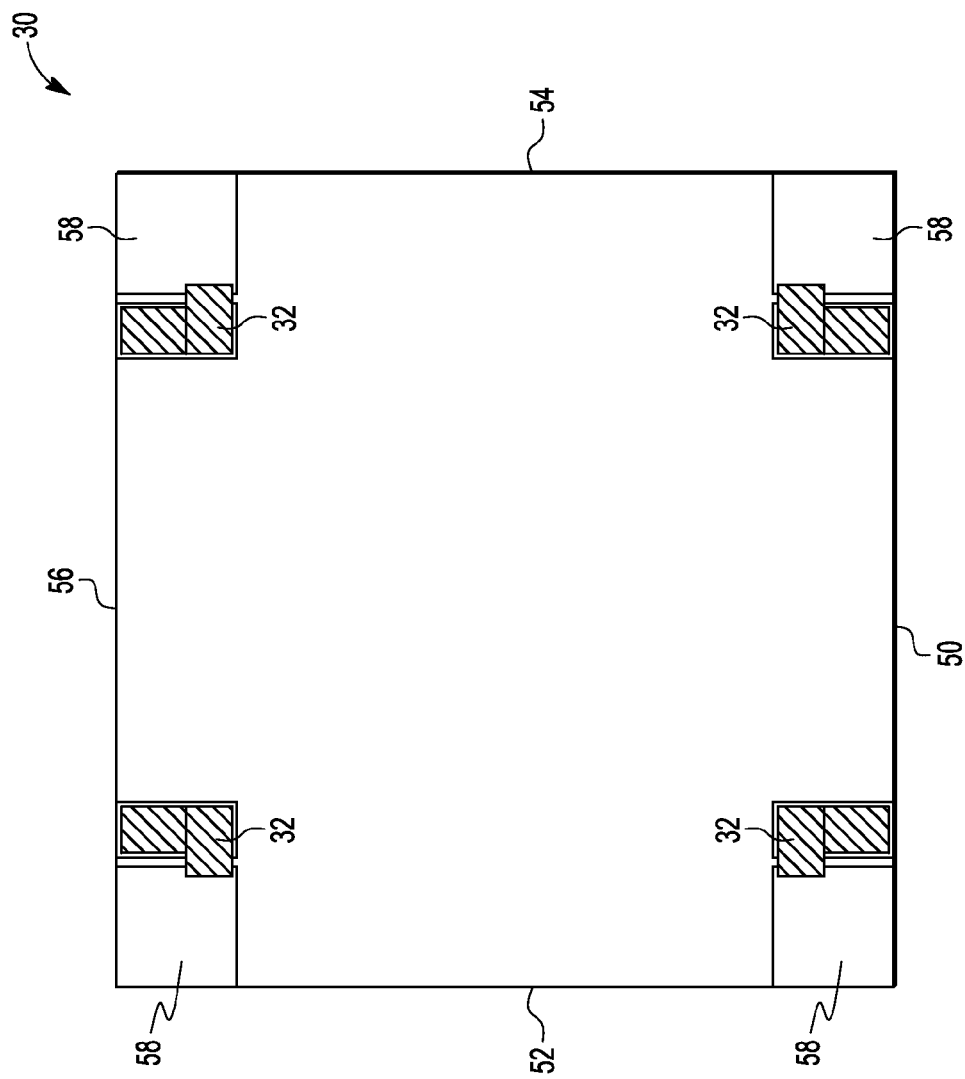
FIG. 5 is a top plan view illustrating the additional bond pads of a semiconductor die in accordance with an embodiment of the present invention.
Figure 6:
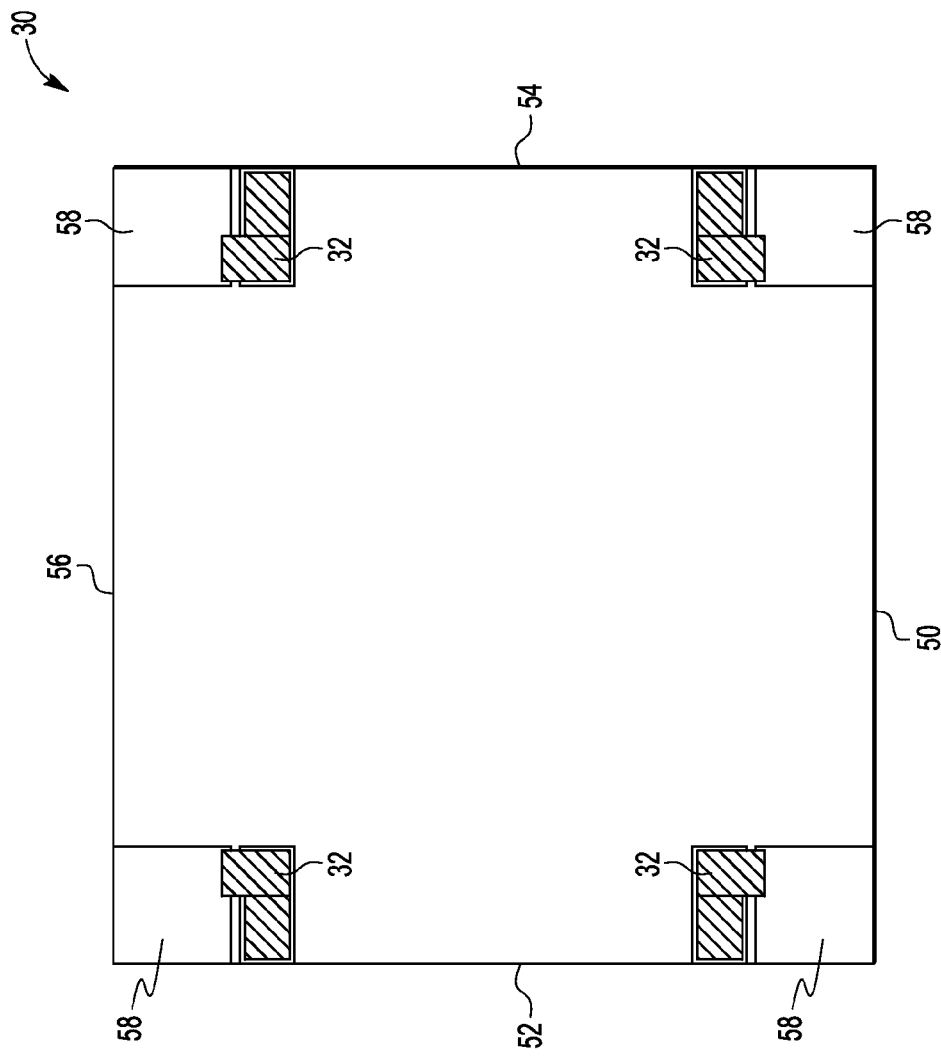
FIG. 6 is a top plan view illustrating the additional bond pads of a semiconductor die in accordance with another embodiment of the present invention.

Other additional bond pads 32 may be laid out in the other corners of the die 30, as shown in FIGS. 5 and 6. FIG. 5 illustrates the placement of four additional bond pads 32 on a top surface of the die 30. More particularly, the semiconductor die 30 has first, second, third and fourth edges 50, 52, 54 and 56, with the second and third edges 52 and 54 being perpendicular to the first and fourth edges 50 and 56. First through fourth rows of bond pads 12 (not shown) are laid out along the edges 50, 52, 54 and 56 between first through fourth corner pads 58. The rows of bond pads along each of the edges are as shown in FIG. 3, so the additional bond pads 32 have IO pad areas that are aligned with the IO pad areas of the other bond pads in the same row and IO probe areas that are aligned with the IO probe areas of an adjacent row.

FIG. 6 is like FIG. 5 except that where FIG. 5 illustrates the additional bond pads 32 located on horizontal edges (i.e., the first and fourth edges 50 and 56) of the die 30, FIG. 6 shows the additional bond pads 32 located on vertical side edges (i.e., the second and third edges 52 and 54) of the die 30.

The bond pads 12 and additional bond pads 32 may be bond over passivation (BOP) type bond pads, which have a final metal layer known by those of skill in the art as an etched metal layer, such as an etched copper layer, that is one of multiple copper layers, and a final layer bond pad. A layer of passivation material is formed over the final metal layer and a metal cap layer is formed over a part of the passivation layer. The metal cap layer is formed over an opening in the passivation layer. The opening allows for electrical connection between the bond pad and the underlying circuitry (not shown) of the semiconductor die and the passivation layer protects the interconnecting circuitry of the semiconductor die from moisture and contamination. The passivation layer may comprise silicon dioxide or silicon nitride. The metal cap layer may be formed of aluminum. However, it should be appreciated that the present invention is not limited to Cu wafer fab applications; the pad layer and the final metal layer including the final metal layer pad, may be formed of other conductive materials in other embodiments. For example, the final metal layer pad may be formed of gold (Au) and the pad layer may be formed of Cu in another embodiment.

The bond pads 12 and additional bond pads 32 are formed in a known manner using existing equipment and processes and thus a detailed description of the manufacture of the bond pads is not required for a complete understanding of the present invention.

As is evident from the foregoing discussion, the present invention provides a bond pad for a semiconductor die that allows for the inclusion of four additional (4) bond pads to the die, with the additional bond pads being located near the four (4) corners of the die. The additional bond pads do not violate design rules even though they extend into corner keep out regions of the die. Further, the additional bond pads do not increase the risk of wire shorting arising from wire looping and wire trajectory variations, or from wire sweep during mold encapsulation. Additionally, the IO pad area and the IO probe area of the additional bond pad are in alignment with other IO pad areas and IO probe areas so no special programming of a wire bonding machine is required. The additional bond pad may be used with existing fine pitch and ultra fine pitch applications without having to increase die sizes.

Finally, the terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It should be understood that, although the terms first, second, etc. and horizontal and vertical are used to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, the bond pad dimensions may vary to accommodate semiconductor device requirements. It is understood, therefore, that this invention is not limited to the particular embodiments disclosed, but covers modifications within the spirit and scope of the present invention as defined by the appended claims.

The invention claimed is:

1. A semiconductor die, comprising:
   a first row of bond pads disposed along a first edge of the device;
   a second row of bond pads disposed along a second edge of the device, wherein the second row is perpendicular to the first row;
   wherein each bond pad includes at least an input/output (IO) pad area for providing an IO connection to circuitry of the device and an IO probe area for receiving a tip of a test probe;
   wherein the IO pad areas of the bond pads of the first row are aligned with each other, the IO probe areas of the bond pads of the first row are aligned with each other, and the IO probe areas of the bond pads of the second row are aligned with each other;
   a first corner keep out area, located between the first and second rows at a first corner of the device, wherein design layout rules specify that a bond pad that is to be probed cannot be placed in the first corner keep out area; and
   a first L-shaped additional bond pad located between the first corner keep out area and a first bond pad in the first row of bond pads, wherein the additional bond pad has an IO pad area that is aligned with the IO pad areas of the bond pads of the first row and an IO probe area that is aligned with the IO probe areas of the bond pads of the second row, and wherein the IO probe area extends into the first corner keep out area.

2. The semiconductor die of claim 1, wherein a predetermined minimum distance between the IO probe area of the first bond pad in the first row and the IO probe areas of the bond pads of the second row of bond pads and the additional bond pad is maintained.

3. The semiconductor die of claim 1, wherein the bond pads of the first row of bond pads have a proximal end adjacent to the first edge and a distal end spaced from the first edge, and wherein the IO pad areas are proximate to the centers of the bond pads and the IO probe areas are located at the distal ends of the bond pads.

4. The semiconductor die of claim 3, wherein the bond pads of the second row of bond pads have a proximal end adjacent to the second edge and a distal end spaced from the second edge, and wherein the IO pad areas are proximate to the centers of the bond pads and the IO probe areas are located at the distal ends of the bond pads.

5. The semiconductor die of claim 4, wherein the bond pads of the first and second rows include an embedded power and ground (PGE) pad area and a PGE probe area.

6. The semiconductor die of claim 5, wherein the PGE probe areas are located at the proximal ends of the bond pads and the PGE pad areas are located between the PGE probe areas and the IO pad areas.

7. The semiconductor die of claim 6, wherein the first additional bond pad has a PGE pad area that is aligned with the PGE pad areas of the bond pads of the first row, and a PGE probe area that is aligned with the PGE probe areas of the bond pads of the first row.

8. The semiconductor die of claim 1, further comprising:
   a third row of bond pads disposed along a third edge of the device, wherein the third edge is perpendicular to the first edge;
   a second corner keep out area, located between the first and third rows at a second corner of the device, wherein the design layout rules specify that a bond pad that is to be probed cannot be placed in the second corner keep out area;
   wherein each bond pad of the third row of bond pads includes at least an IO pad area for providing an IO connection to the device circuitry and an IO probe area for receiving a tip of a test probe;
   wherein the IO pad areas of the bond pads of the third row are aligned with each other and the IO probe areas of the bond pads of the third row are aligned with each other; and
   a second L-shaped additional bond pad located between the second corner keep out area and a last bond pad in the first row of bond pads, wherein the second additional bond pad has an IO pad area that is aligned with the IO pad areas of the bond pads of the first row and an IO probe area that is aligned with the IO probe areas of the bond pads of the third row, and wherein the IO probe area extends into the second corner keep out area.

9. The semiconductor die of claim 8, wherein
   a first predetermined minimum distance between the IO probe area of the first bond pad in the first row and the IO probe areas of the bond pads of the second row of bond pads and the first additional bond pad is maintained,
   a second predetermined minimum distance between the IO probe area of the last bond pad in the first row and the IO probe areas of the bond pads of the third row of bond pads and the second additional bond pad is maintained, and wherein the first predetermined minimum distance equals the second predetermined minimum distance.

10. The semiconductor die of claim 9, further comprising:
a fourth row of bond pads disposed along a fourth edge of the device, wherein the fourth edge is adjacent and perpendicular to the second and third edges;
third and fourth corner keep out areas, respectively located between the second and fourth edges at a third corner of the device and between the third and fourth edges at a fourth corner of the device, wherein the design layout rules specify that a bond pad that is to be probed, cannot be placed in either of the third or fourth corner keep out areas;
wherein each bond pad of the fourth row of bond pads includes at least an IO pad area for providing an IO connection to the device circuitry and an IO probe area for receiving a tip of a test probe, and wherein the IO pad areas of the bond pads of the fourth row are aligned with each other and the IO probe areas of the bond pads of the fourth row are aligned with each other;
a third L-shaped additional bond pad located between the third corner keep out area and a first bond pad in the fourth row of bond pads, wherein the third additional bond pad has an IO pad area that is aligned with the IO pad areas of the bond pads of the fourth row and an IO probe area that is aligned with the IO probe areas of the bond pads of the second row, and wherein the IO probe area extends into the third corner keep out area; and
a fourth L-shaped additional bond pad located between the fourth corner keep out area and a last bond pad in the fourth row of bond pads, wherein the fourth additional bond pad has an IO pad area that is aligned with the IO pad areas of the bond pads of the fourth row and an IO probe area that is aligned with the IO probe areas of the bond pads of the third row, and wherein the IO probe area extends into the fourth corner keep out area.

11. A semiconductor die, comprising:
a first row of bond pads disposed along a first edge of the device;
a second row of bond pads disposed along a second edge of the device, wherein the second row is perpendicular to the first row;
a third row of bond pads disposed along a third edge of the device, wherein the third row is perpendicular to the first row and parallel to the second row;
a fourth row of bond pads disposed along a fourth edge of the device, wherein the fourth row is parallel to the first row and perpendicular to the second and third rows;
wherein each bond pad includes at least an input/output (IO)) pad area for providing an IO connection to circuitry of the device and an IO probe area for receiving a tip of a test probe;
wherein the IO pad areas of each row are aligned with the other IO pad areas of the same row and the IO probe areas of each row are aligned with the other IO probe areas of the same row;
first, second, third and fourth corner keep out areas respectively located in each of the four corners of the semiconductor die, wherein design layout rules specify that bond pads to be probed cannot be placed in the corner keep out areas; and
a first L-shaped additional bond pad located between the first corner keep out area and a first bond pad in the first row of bond pads, wherein the additional bond pad has an IO pad area that is aligned with the IO pad areas of the bond pads of the first row and an IO probe area that is aligned with the IO probe areas of the bond pads of the second row, and wherein the IO probe area extends into the first corner keep out area;
a second L-shaped additional bond pad located between the second corner keep out area and a last bond pad in the first row of bond pads, wherein the second additional bond pad has an IO pad area that is aligned with the IO pad areas of the bond pads of the first row and an IO probe area that is aligned with the IO probe areas of the bond pads of the third row, and wherein the IO probe area extends into the second corner keep out area;
a third L-shaped additional bond pad located between the third corner keep out area and a first bond pad in the fourth row of bond pads, wherein the third additional bond pad has an IO pad area that is aligned with the IO pad areas of the bond pads of the fourth row and an IO probe area that is aligned with the IO probe areas of the bond pads of the second row, and wherein the IO probe area extends into the third corner keep out area; and
a fourth L-shaped additional bond pad located between the fourth corner keep out area and a last bond pad in the fourth row of bond pads, wherein the fourth additional bond pad has an IO pad area that is aligned with the IO pad areas of the bond pads of the fourth row and an IO probe area that is aligned with the IO probe areas of the bond pads of the third row, and wherein the IO probe area extends into the fourth corner keep out area.

12. The semiconductor die of claim 11, wherein
a predetermined minimum distance between the IO probe area of the first bond pad in the first row and the IO probe areas of the bond pads of the second row of bond pads and the first additional bond pad is maintained,
the predetermined minimum distance is maintained between the IO probe area of the last bond pad in the first row and the IO probe areas of the bond pads of the third row of bond pads and the second additional bond pad,
the predetermined minimum distance is maintained between the IO probe area of the first bond pad in the fourth row and the IO probe areas of the bond pads of the second row of bond pads and the third additional bond pad, and
the predetermined minimum distance is maintained between the IO probe area of the last bond pad in the fourth row and the IO probe areas of the bond pads of the third row of bond pads and the fourth additional bond pad.

13. An additional bond pad for a semiconductor die, wherein the semiconductor die has first and second major surfaces and four sides, keep out areas in the four corners of the first major surface, wherein design rules specify that bond pads are not to be placed within the corner keep out areas, and a plurality of rows of generally rectangular bond pads, each row located along respective sides on the first major surface between respective corner keep out areas, wherein the bond pads have an IO pad area proximate a central part thereof and a probe area at a distal end thereof, and wherein the IO pad areas of each row are aligned and the probe areas of each row are aligned, the additional bond pad comprising:
a first, vertical section having a proximal end that extends from one of the sides of the semiconductor die inwardly to a distal end, wherein the vertical section is located between one of the corner keep out areas and an adjacent bond pad, and wherein the first section has an IO pad area at the distal end thereof that is aligned with the IO pad areas of the bond pads in the same row; and
a second, horizontal section that abuts the distal end of the first section and extends away from the first section toward and into the adjacent corner keep out area, the second section having a probe area at a distal end thereof that is aligned with the probe areas of bond pads in an adjacent row.

14. The additional bond pad of claim 13, wherein the first and second sections form an L-shape.

15. The additional bond pad of claim 13, wherein a predetermined minimum distance is maintained between the IO probe area of a first bond pad in a first one of the rows and the IO probe areas of the bond pads of an adjacent row of bond pads, including the IO probe area of the additional bond pad.

16. The additional bond pad of claim 13, wherein the first vertical section includes an embedded power ground (PGE) area and a PGE probe area.

* * * * *